United States Patent
Shimogaki et al.

(10) Patent No.: US 6,793,969 B2
(45) Date of Patent: Sep. 21, 2004

(54) METHOD OF FORMING AN OXIDATION-RESISTANT TISIN FILM

(75) Inventors: Yukihiro Shimogaki, Toyko (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 19 days.

(21) Appl. No.: 10/210,204

(22) Filed: Aug. 2, 2002

(65) Prior Publication Data

US 2003/0148605 A1 Aug. 7, 2003

(30) Foreign Application Priority Data

Feb. 6, 2002 (JP) ........................................ 2002-030059

(51) Int. Cl.[7] ............................................. C23C 16/34
(52) U.S. Cl. ........................ 427/255.36; 427/255.391; 427/255.393; 427/255.394; 427/255.7
(58) Field of Search ..................... 427/255.36, 255.391, 427/255.393, 255.394, 255.7

(56) References Cited

U.S. PATENT DOCUMENTS 6,194,310 B1 * 2/2001 Hsu et al. ................... 438/643

2003/0190497 A1 * 10/2003 Yang et al. ................. 428/698

FOREIGN PATENT DOCUMENTS

JP 2001144032 A * 5/2001 ......... H01L/21/285

OTHER PUBLICATIONS

B208 Abstract, published in Kanagawa Meeting of the Society of Chemical Engineers on Aug. 7, 2002, describing a CVD process of an oxidation–resistant Ti–Si–N barrier metal film.

* cited by examiner

*Primary Examiner*—Timothy Meeks
(74) *Attorney, Agent, or Firm*—Pillsbury Winthrop LLP (57) ABSTRACT

A CVD process of forming a conductive film containing Ti, Si and N includes a first step of supplying gaseous sources of Ti, Si and N simultaneously to grow a conductive film and a second step of supplying the gaseous sources of Ti, Si and N in a state that a flow rate of the gaseous source of Ti is reduced, to grow the conductive film further, wherein the first step and the second step are conducted alternately.

13 Claims, 13 Drawing Sheets

METHOD OF FORMING AN OXIDATION-RESISTANT TISIN FILM

BACKGROUND OF THE INVENTION

The present invention generally relates to film forming technology and more particularly to a method of forming a conductive film by a CVD process and also a CVD apparatus.

Film forming technology is a fundamental and important technology in the fabrication process of semiconductor devices.

When fabricating a semiconductor device, it has been widely practiced to form a semiconductor film or an insulation film by a CVD (chemical vapor deposition) process. On the other hand, other processes, such as a sputtering process, have been used for forming conductive films such as wiring layers.

On the other hand, there is a growing need for the technology of forming a conductive film, such as a metal film or conductive metal compound film, as the capacitor electrode of high-dielectric or ferroelectric MIM capacitors, as in the case of a memory capacitor of a DRAM (dynamic random access memory) or a ferroelectric capacitor of a ferroelectric memory device, wherein such an MIM capacitor uses a high-dielectric film or a ferroelectric film as the capacitor insulation film in combination with the capacitor electrode.

Figure 1:
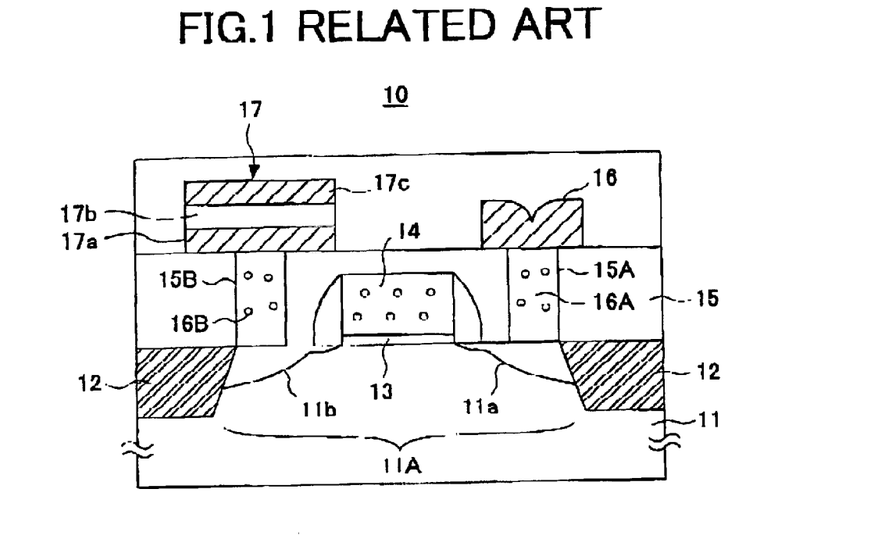
FIG. 1 is a diagram showing the construction of a conventional DRAM that uses a high-dielectric MIM capacitor.

FIG. 1 shows the construction of a typical DRAM 10 that has such an MIM high-dielectric capacitor.

Referring to FIG. 1, the DRAM 10 is constructed on a Si substrate 11 in correspondence to a device region 11A defined by a device isolation structure 12, wherein there is provided a gate electrode 14 having a polycide structure on the Si substrate 11 via an intervening gate insulation film 13. The gate electrode 14 thus formed constitutes a part of the word line of the DRAM. Further, a pair of diffusion regions 11a and 11b are formed in the Si substrate 11 at both lateral sides of the gate electrode 14, and the gate electrode 14 is covered with an interlayer insulation film 15 provided on the Si substrate 12.

On the interlayer insulation film 15, there is provided a bit line electrode in correspondence to the diffusion region 11a, wherein the bit line electrode 16 makes a contact with the diffusion region 11a at a contact hole 15A formed in the interlayer insulation film 15 via a polysilicon contact plug 16A filling the contact hole 15A.

On the interlayer insulation film 15, there is provided a memory cell capacitor 17 having an MIM structure in correspondence to the diffusion region 11b, wherein the MIM capacitor 17 makes an electrical contact with the diffusion region 11b at a contact hole 15B formed in the interlayer insulation film 15 via a polysilicon contact plug 16B provided in the contact hole 15B.

It should be noted that the memory cell capacitor 17 includes a lower electrode 17a formed on the interlayer insulation film 15 in electrical contact with the contact plug 16B, a capacitor insulation film 17b formed on the lower electrode 17a and an upper electrode 17c formed on the capacitor insulation film 17b, wherein recent, highly miniaturized DRAMs tend to use a high dielectric material such as $Ta_2O_5$ characterized by a very large specific dielectric constant, for the capacitor insulation film 17b in place of conventional $SiO_2$ film or an ONO film, in which a SiN film is sandwiched by a pair of $SiO_2$ films.

Further, it is possible to construct a ferroelectric memory from such a DRAM, by substituting the high-dielectric film constituting the capacitor insulation film 17b with a ferroelectric film such as PZT ($Pb(Zr,Ti)O_3$) or SBT ($SrBi_2(Ta,Nb)_2O_9$)

In the case of a high-dielectric film such as a $Ta_2O_5$ film or a ferroelectric film, it is characteristic that film formation process includes a process conducted in an oxidizing atmosphere. Further, it is generally thought essential to apply a thermal annealing process in an oxidizing atmosphere for compensating for oxygen defects that are formed in the film.

In the case of forming a $Ta_2O_5$ film by a CVD process, for example, the deposition is conducted in a 100% oxygen atmosphere or reduced pressure oxygen atmosphere at the substrate temperature of about 450° C. Thereafter, crystallization and oxygen compensation process are conducted in an oxygen atmosphere at the temperature of 650° C. A similar process is required also in the case of depositing a ferroelectric film such as a PZT film or a SBT film.

Because of this reason, the DRAMs having a high-dielectric capacitor uses Pt, or Ru or Ir, for the lower electrode, wherein it should be noted that Pt is less susceptible to oxidation while Ru or Ir forms a conductive oxide when oxidized.

However, such a high-temperature thermal process conducted in an oxidizing atmosphere can still cause the problem that oxygen in the atmosphere or in the capacitor insulation film 17b may reach the polysilicon plug 16B after penetrating through the lower electrode 17a. When this takes place, there is caused oxidation in the polysilicon plug 16B, while such an oxidation of the polysilicon plug 16B causes an increase of contact resistance and resultant decrease of the operational speed of the device. Further, such an oxidation of the polysilicon plug 16B causes another serious problem that a parasitic capacitor having a small capacitance is inserted in series to the high-dielectric capacitor when viewed in the equivalent circuit diagram. When this takes place, the increase of the capacitance of the memory cell capacitor 17, achieved by the use of the high-dielectric capacitor, is canceled out.

In order to suppress the penetration of oxygen into the contact plug associated with such a thermal annealing process in the oxidizing atmosphere, it has been proposed to use a conductive TiSiN film that contains Ti, Si and N. A TiSiN film is actually a TiN film containing Si, wherein incorporation of Si into a TiN with appropriate amount changes the film structure to an amorphous state and the amorphous film thus obtained blocks the penetration of oxygen effectively.

Even in the case such an amorphous TiSiN film is used, however, it has been difficult to block the penetration of oxygen in the case the thermal processing is conducted at the temperature exceeding 600° C. in an oxygen atmosphere, as in the case of forming the high-dielectric film such as a $Ta_2O_5$ film.

SUMMARY OF THE INVENTION

Accordingly, it is a general object of the present invention to provide a novel and useful film forming method and a film forming apparatus wherein the foregoing problems are eliminated.

Another object of the present invention is to provide a film forming method of a conductive film effective for an oxygen barrier by a CVD process, as well as to provide an apparatus for forming such a conductive film.

Another object of the present invention is to provide a method of forming a conductive film containing Ti, Si and N on a substrate by supplying a gaseous source of Ti, a gaseous source of Si and a gaseous source of N, comprising:

a first step of supplying said gaseous source of Ti, said gaseous source of Si and said gaseous source of N to a surface of said substrate simultaneously to grow said conductive film; and a second step of supplying said gaseous source of Ti, said gaseous source of Si and said gaseous source of N to said surface of said substrate in a state that a flow rate of said gaseous source of Ti is reduced to grow said conductive film further, wherein said first step and said second step are conducted alternately.

Another object of the present invention is to provide a method of forming a conductive film containing Ti, Si and N on a substrate by supplying a gaseous source of Ti, a gaseous source of Si and a gaseous source of N, comprising the step of:

supplying said gaseous source of Ti, said gaseous source of Si and said gaseous source of N to a surface of said substrate simultaneously, wherein a partial pressure of said Ti gaseous source is increased and decreased repeatedly and alternately.

Another object of the present invention is to provide a method of fabricating a semiconductor device, said semiconductor device comprising a substrate carrying an active device, an insulation film provided on said substrate so as to cover said active layer, a contact plug formed in said insulation film in contact with said active layer electrically, and a capacitor provided on said insulation film in electrical contact with said contact plug, said method comprising the steps of:

forming a barrier containing Ti, Si and N layer on said insulation film in electrical contact with said contact plug;

forming a lower electrode layer on said barrier layer;

depositing a high-dielectric film on said lower electrode layer;

annealing said high-dielectric film in an oxygen atmosphere; and forming, after said annealing process, an upper electrode on said lower electrode, said step of forming said barrier layer comprising:

a first step of growing said barrier on said insulation film by supplying a gaseous source of Ti, a gaseous source of Si and a gaseous source of N simultaneously; and a second step of growing said barrier layer further by supplying said gaseous source of Ti, said gaseous source of Si and said gaseous source of N in a state that a flow rate of said gaseous source of Ti is reduced, wherein said first step and said second step are conducted alternately.

Another object of the present invention is to provide a conductive film containing Ti, Si and N, said conductive film containing Ti with a concentration profile changing periodically in a thickness direction, said conductive film containing Si with a concentration profile changing periodically in said thickness direction, wherein said concentration profile of Ti and said concentration profile of Si determine a concentration of Ti and a concentration of Si in said conductive film such that said concentration of Ti is increased where said concentration of Si is decreased and such that said concentration of Ti is decreased where said concentration of Si is increased.

Another object of the present invention is to provide a film forming apparatus, comprising:

a reactor evacuated from an evacuation port, said reactor accommodating therein a stage;

an evacuation system connected to said evacuation port;

a first source supply line supplying a first gaseous source containing Ti to said reactor via a switching valve;

a second source supply line supplying a second gaseous source containing Si to said reactor;

a third source supply line supplying a third gaseous source containing N to said reactor;

a pre-flow line provided between said switching valve and said evacuation system for bypassing said first gaseous source to said evacuation system; and a controller controlling said switching valve, said controller interrupts supply of said first gaseous source to said reactor intermittently and repeatedly.

According to the present invention, there is formed a region of reduced Ti concentration level, and hence increased Si concentration level, in a conductive film of a Ti—Si—N system such that the region of reduced Ti concentration level is repeated in the thickness direction of the conductive film, by interrupting the supply of the Ti gaseous source repeatedly and intermittently at the time of film formation of the conductive film. As a result, diffusion of oxygen into the conductive film is effectively suppressed, and the conductive film of the present invention functions as an effective oxygen barrier.

Other objects and further features of the present invention will become apparent from the following detailed description when read in conjunction with the attached drawings.

DETAILED DESCRIPTION OF THE PREFERRED EMBODIMENTS

First Embodiment

Figure 2A:
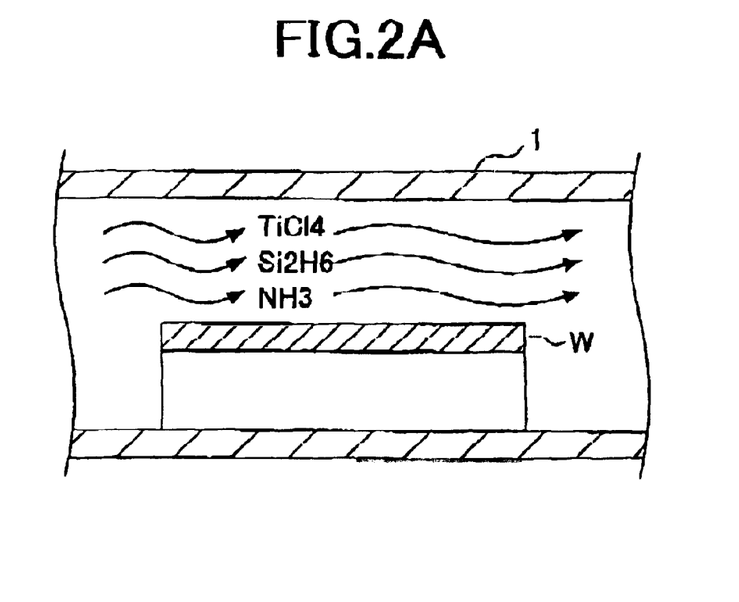
FIGS. 2A and 2B are diagrams explaining a first embodiment of the present invention.
Figure 2B:
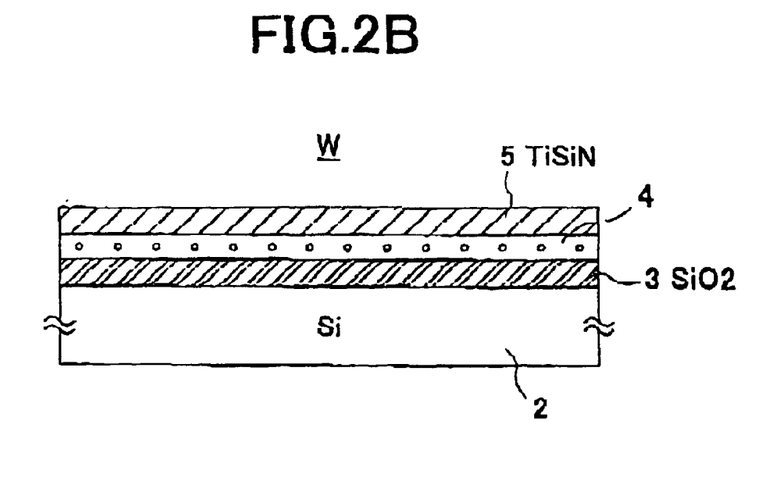

FIGS. 2A and 2B show the experiment conducted by the inventor of the present invention and constituting the foundation of the present invention as a first embodiment.

Referring to FIG. 2A, a substrate W is introduced into a CVD reactor tube 1, and a $TiCl_4$ gas is introduced into the reactor tube 1 as a gaseous source of Ti together with a $Si_2H_6$ gas and an $NH_3$ gas, wherein the $Si_2H_6$ gas and the $NH_3$ gas are uses as a gaseous source of Si and a gaseous source of N respectively.

FIG. 2B shows the construction of a specimen used in the foregoing experiment as the substrate W.

Referring to FIG. 2B, the substrate W is a Si substrate 2 carrying a thermal oxide film 3, and a polysilicon film 4 is formed on the surface of the thermal oxide film 3 uniformly with a thickness of 100 nm. Further, a conductive film 5 of the Ti—Si—N system is formed on the polysilicon film 4.

In the experiment, the inventor of the present invention made an attempt to form the Ti—Si—N conductive film 5 in the apparatus of FIG. 2A while changing the partial pressure of the $TiCl_4$ gas, the partial pressure of the $Si_2H_6$ gas and further the partial pressure of the $NH_3$ gas variously.

As a result of the experiment, it was discovered that a TiSiN film containing Si with a concentration level of about 20 atomic percent is obtained with an amorphous state or near amorphous state in the case the deposition is conducted at the substrate temperature of 500° C. under the total pressure of 2 Torr (266 Pa), provided that the partial pressure of the $Si_2H_6$ gas is set to 1000 mTorr (133 Pa), the partial pressure of the $TiCl_4$ gas is set to 100 mTorr (13.3 Pa) and the partial pressure of the $NH_3$ gas to 100 mTorr (13.3 Pa). Further, it was discovered that the incorporation of Si into the TiSiN film is blocked when the partial pressure of the $TiCl_4$ gas or the $NH_3$ gas is increased.

Figure 3:
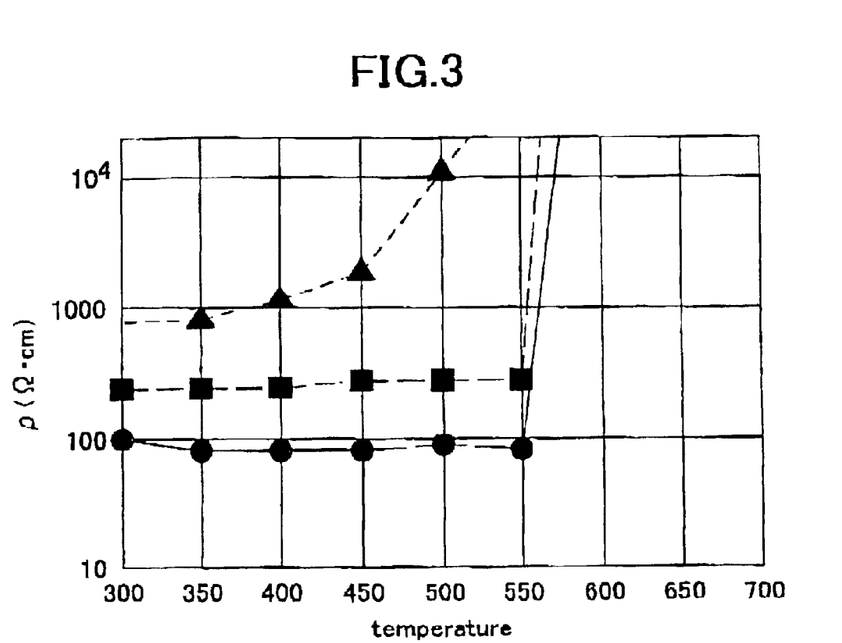
FIGS. 3–8 are further diagrams explaining the first embodiment.

FIG. 3 shows the result of measurement of the specific resistance for the TiSiN film after applying a thermal oxidation process, wherein ◇ shows the specific resistance of the TiSiN film 5 obtained according to the foregoing experiment, while ■ represents the specific resistance of a TiN film formed by a CVD process. Further, ● represents the specific resistance of the TiN film formed by a sputtering process.

Referring to FIG. 3, the TiN film formed by a CVD process or sputtering process shows a sharp increase of specific resistance when a thermal oxidation process is applied with a temperature of 550° C. or more. In the TiSiN film obtained in the foregoing experiment, on the other hand, there is observed an increase of specific resistance at the temperature slightly exceeding 350° C., indicating that oxidation is already started at this temperature.

In view of the fact that the TiSiN film obtained according to the foregoing experiment contains Cl with high concentration level, it is interpreted that the accelerated oxidation of FIG. 3 indicates the effect of the Cl atoms damaging the film structure upon escaping at the time of the thermal annealing process. As a result of such damaging, there are formed numerous oxygen diffusion paths in the TiSiN film, and diffusion of oxygen taking place along such oxygen diffusion paths becomes the cause of the accelerated oxidation observed in FIG. 3.

Figure 4:
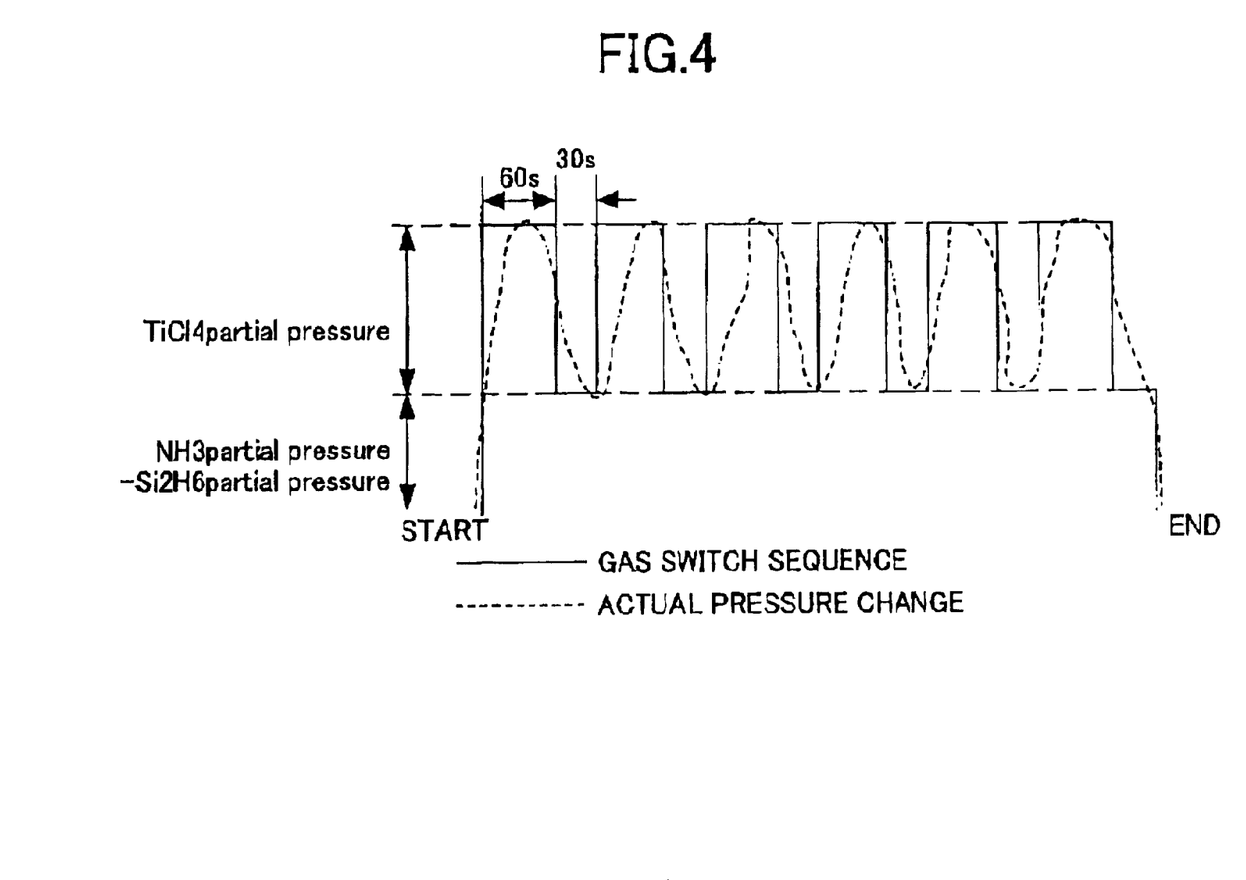

In view of the knowledge of FIG. 3, the inventor of the present invention conceived the idea of forming a TiSiN film according to a source supply sequence as represented in FIG. 4.

Referring to FIG. 4, it should be noted that the flow rate of the $NH_3$ gas and the $Si_2H_6$ gas and hence the partial pressure of these gases at the surface of the substrate W are held constant, and the supply of the $TiCl_4$ gas is interrupted intermittently.

In more detail, the $TiCl_4$ gas is supplied 60 seconds and then interrupted for 30 seconds in the sequence of FIG. 4, wherein it can be seen that this procedure is repeated six times.

As a result, the partial pressure of $TiCl_4$ is increased and decreased alternately in the reactor 1, wherein the partial pressure of $TiCl_4$ is increased during the interval in which supply of $TiCl_4$ is made, while the partial pressure of $TiCl_4$ is decreased during the interval in which supply of $TiCl_4$ is interrupted. During the interval of high $TiCl_4$ partial pressure, the TiSiN film has a large Ti concentration level while during the interval of low $TiCl_4$ partial pressure, the Ti concentration level in the TiSiN film is decreased. As long as the duration of interruption of the $TiCl_4$ source is within about 30 seconds, it should be noted that the partial pressure of $TiCl_4$ in the reactor 1 does not become zero, and substantial growth of the TiSiN film is continued with a reduced Ti concentration level by using the residual $TiCl_4$ gas in the reactor 1.

Figure 5:
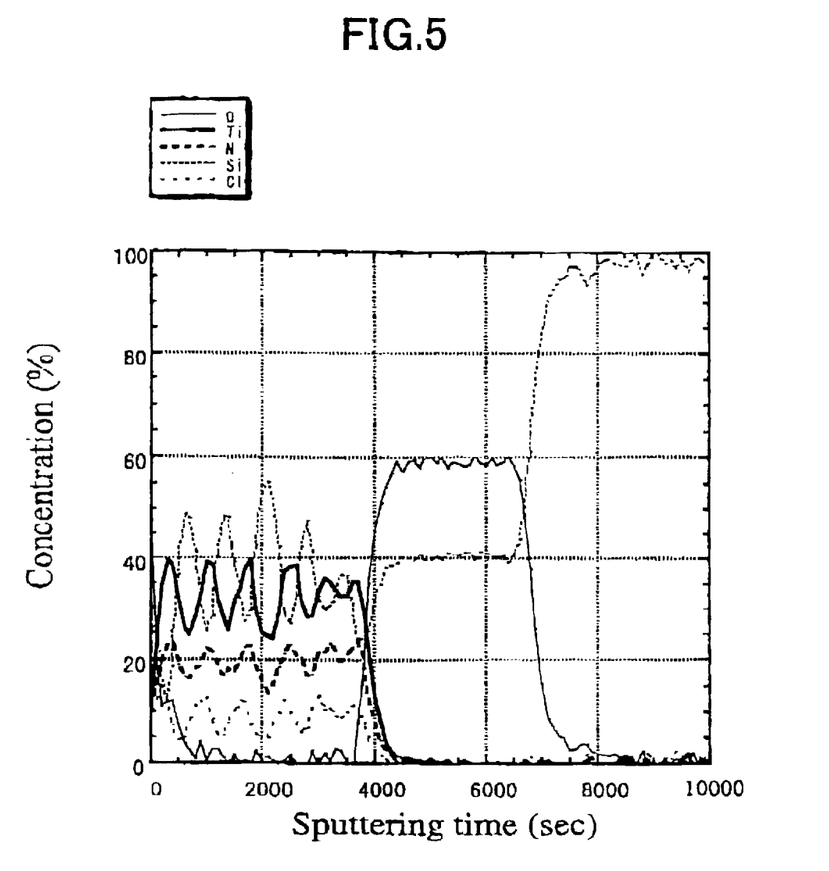

FIG. 5 shows the distribution of Ti, Si, N, Cl and O in the thickness direction of a TiSiN film for the case of forming the TiSiN film on an $SiO_2$ film covering a silicon substrate while supplying the $Si_2H_6$ and $NH_3$ gaseous sources at respective constant flow rates while interrupting the supply of the TiCl4 source gas intermittently. It should be noted that the result of FIG. 5 is obtained by an XPS (X-ray photoelectron spectroscopy) analysis.

It should be noted that the result of FIG. 5 is obtained for the case the growth of the TiSiN film is made at the substrate temperature of 500° C. under the reactor internal pressure of 2 Torr (266 Pa) by setting the partial pressures of the $Si_2H_6$ source and the $NH_3$ source respectively to 1000 mTorr (133 Pa) and 200 mTorr (26.6 Pa) while interrupting the supply of the $TiCl_4$ gas intermittently according to the sequence of FIG. 4. In the sequence of FIG. 4, the phase of supplying the $TiCl_4$ gas for 60 seconds and the phase of interrupting the $TiCl_4$ gas for 30 seconds are repeated six times, as noted before. Thereby, the partial pressure of the $TiCl_4$ gas is set to 100 mTorr (13.3 Pa) in the state the $TiCl_4$ gas is supplied to the reactor 1. The TiSiN film thus formed had a total thickness of 120 nm.

Figure 6:
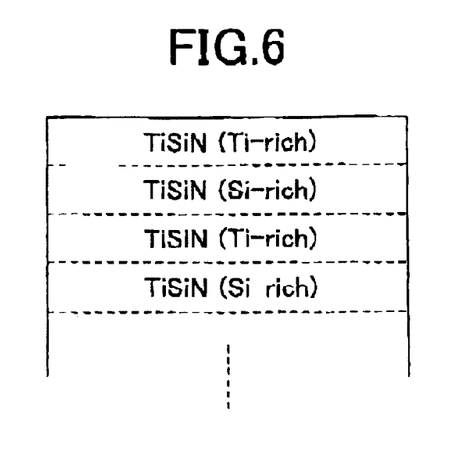

Thus, in the TiSiN film, the Ti concentration level increases and decreases alternately in the thickness direction as can be seen in FIG. 5, and thus, there is formed a structure in which a layer of TiSiN enriched with Ti and depleted with Si and a layer of TiSiN depleted with Ti and enriched with Si are stacked alternately as represented in FIG. 6. Further, FIG. 5 shows that a large amount of Si is introduced into the TiSiN film when the supply of the $TiCl_4$ gas is interrupted.

Figure 7:
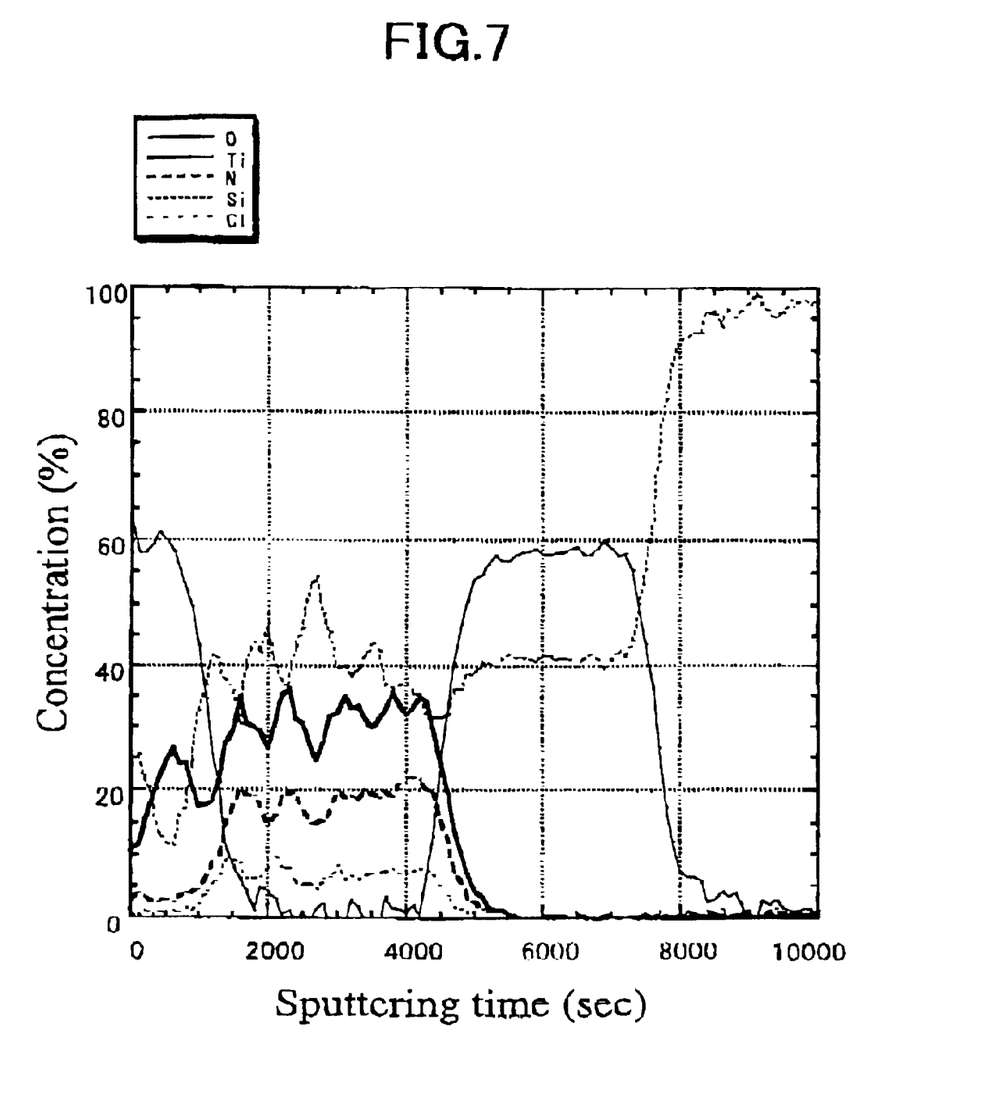

FIG. 7 shows the distribution profile of the respective elements in the thickness direction for the case the specimen of FIG. 5 is subjected to a thermal annealing process in a 100% oxygen atmosphere at 660° C. for two minutes under the pressure of 100 Torr (13.3 kPa).

Referring to FIG. 7, it can be seen that the alternate distribution profile of Ti and Si of FIG. 5 is preserved after the thermal annealing process.

Further, the profile of FIG. 7 clearly indicates that penetration of oxygen is blocked substantially completely within two or three TiSiN layers in the layered construction of FIG. 6.

It is believed that this effect has been caused as a result of capturing of invading oxygen by the Si-enriched TiSiN layer, which in turn is caused as a result of coupling of oxygen with the Si atoms contained therein with high concentration level. Thereby, it should be noted that the TiSiN layer contains also Ti atoms with an effective amount, and thus, there occurs no problem such as loss of electrical conductivity.

Figure 8:
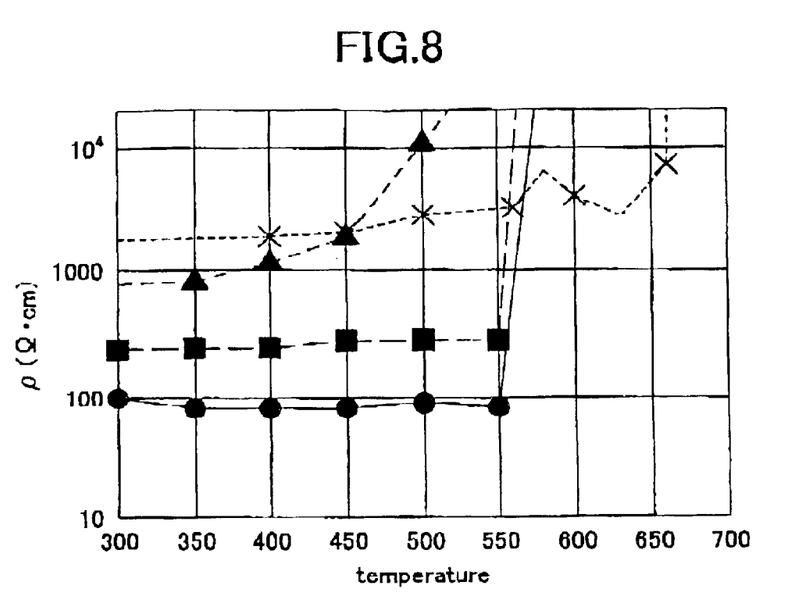

FIG. 8 shows the resistance to oxidation for the multi-layered TiSiN film of FIG. 5 or 6, wherein FIG. 8 is a diagram similar to the one explained with reference to FIG. 3 before but includes the result for the foregoing multilayered TiSiN film as represented by X.

Referring to FIG. 8, it can be seen that there occurs no substantial increase of specific resistance until the annealing temperature reaches 650° C., and that there occurs a sharp increase of specific resistance when the annealing temperature has exceeded 650° C.

From the result of FIG. 8, it was confirmed that there occurs no substantial oxidation in the TiSiN film of the present embodiment as long as the annealing temperature does not exceed 650° C., wherein this suppressing of oxidation is attributed to the capturing of the invading oxygen by the TiSiN layer enriched with Si. Thus, by providing such a TiSiN layer enriched with Si in the TiSiN film as represented in FIG. 6, further penetration of oxygen into the interior of the film is successfully blocked.

Figure 9:
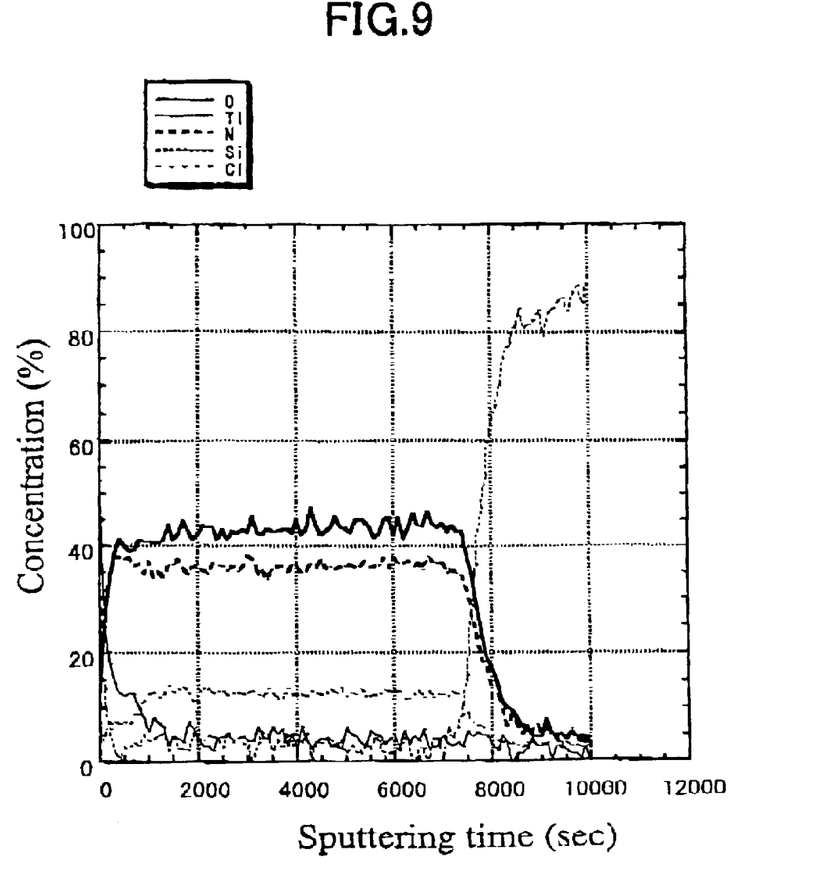
FIGS. 9 and 10 are diagrams showing the result of a comparative experiment.
Figure 10:
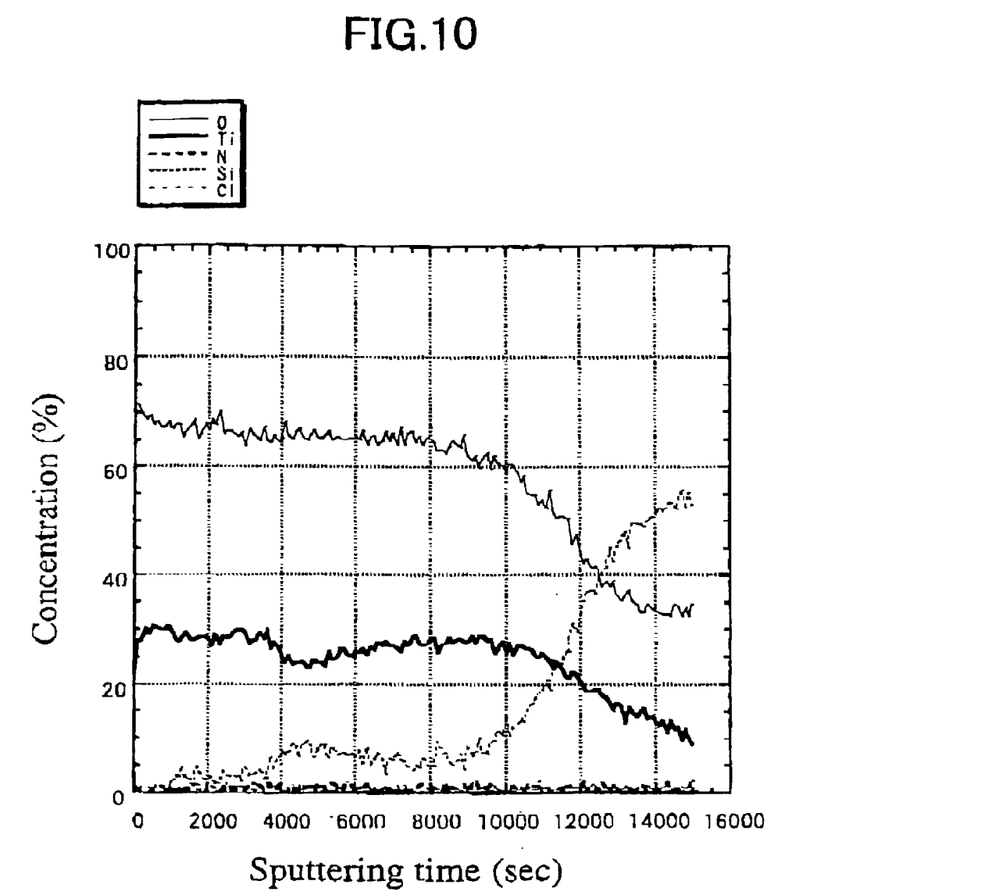

FIGS. 9 and 10 show the result of a comparative experiment, wherein a TiN film substantially free from Si is formed by a CVD process from a $TiCl_4$ source and an $NH_3$ source with a thickness of about 100 nm, wherein FIG. 9 shows the depth profile of Ti, N, Cl, O and Si in the TiN film observed by XPS analysis for an as-deposited state of the TiN film, while FIG. 10 shows the depth profile of Ti, N, Cl, O and Si for the case the TiN film is subjected to an oxidation process at 660° C. for two minutes in a 100% oxygen atmosphere under the total pressure of 1000 Torr (13.3 kPa).

Referring to FIG. 9, it can be seen that the TiN film is substantially free from oxygen in the as-deposited state and a clear boundary is observed between the TiN film and the underlying $Sio_2$ film, while in the profile of FIG. 10, on the other hand, there is caused substantial diffusion of oxygen into the TiN film, and associated with this, it can be seen that the boundary between the TiN film and the $Sio_2$ film has become unclear.

Comparing the result of FIG. 10 with the result of FIG. 7, it can be seen that the TiN film of the present invention has excellent oxidation resistance and functions as a very effective oxygen barrier.

Second Embodiment

Figure 11:
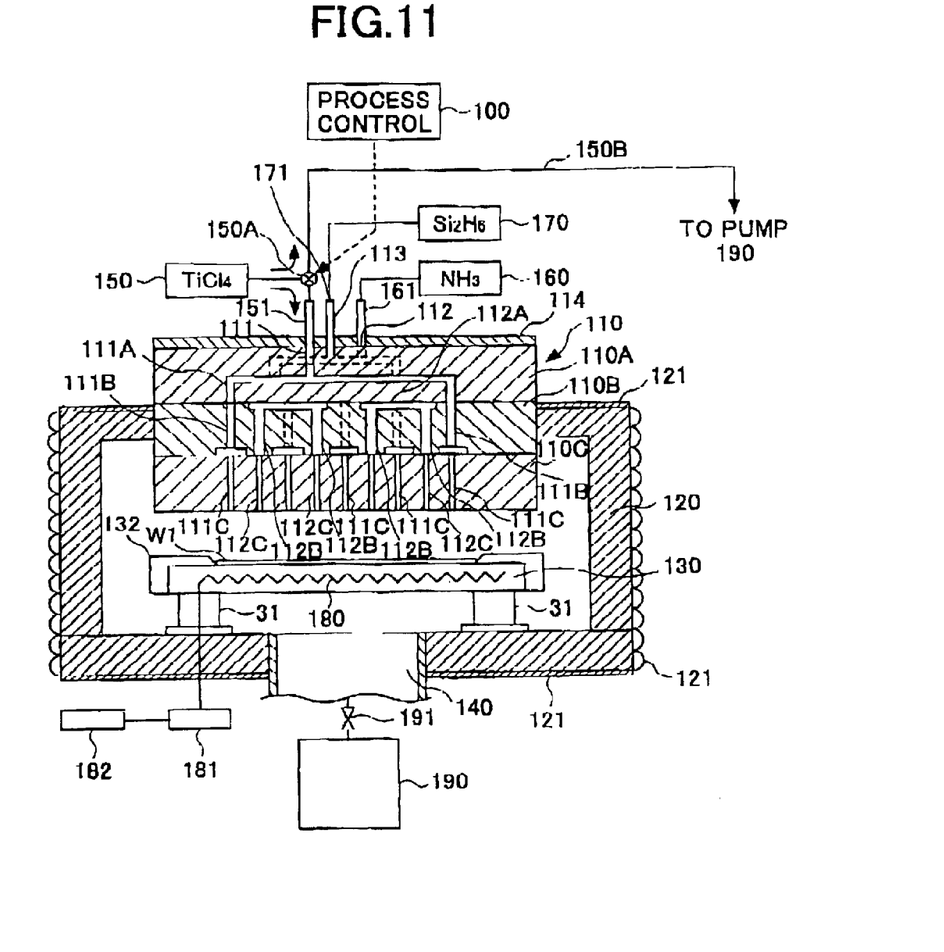
FIG. 11 is a diagram showing the construction of a CVD apparatus according to a second embodiment of the present invention.

FIG. 11 shows the construction of a pyrolytic CVD apparatus (designated hereinafter as "deposition apparatus") used for forming a TiSiN conductive film functioning as an oxygen barrier, according to a second embodiment of the present invention.

Referring to FIG. 11, the deposition apparatus includes a showerhead 110 for supplying a gaseous source and an airtight reactor vessel 120 accommodating therein the foregoing showerhead 110, wherein the reactor vessel 120 further accommodates therein a stage 130 at a central part thereof for supporting a substrate W. The reactor vessel 120 further has an evacuation tube 140 for evacuating the interior of the reactor vessel 120.

It should be noted that the shower head 110 supplies a first source gas containing Ti such as the $TiCl_4$ gas into the interior of the reactor vessel 120, together with a second source gas containing nitrogen such as the $NH_3$ gas via respective mass flow controllers not illustrated. As represented in FIG. 11, the stage 130 is supported by a support member 131 in the reactor vessel 120.

As represented in FIG. 11, the shower head 110 is provided on the ceiling of the reactor vessel 120 generally at the central part of the ceiling, such that a bottom surface of the shower head 110 becomes generally parallel to the stage 130.

The shower head 110 has a construction in which blocks 110A, 110B and 110C are stacked with each other, wherein the uppermost block 110A has first and second inlet ports 111 and 112 respectively connected to a $TiCl_4$ gaseous source 150 and an $NH_3$ gaseous source 160 via lines 151 and 161.

The gas inlet port 111 is branched in the upper block 110A into first branched passages 11A, while the gas inlet port 112 is branched similarly in the upper block 110A into second branched passages 112A, wherein the branched passages 111A and 112A form uniformly distributed openings at the bottom surface of the block 110A.

The central block 110B, on the other hand, is formed with first and second gas passages 111B and 112B such that the first gas passage 111B are in communication with the first branched passages 111A and the second gas passages 112B are in communication with the second branched passages 111B at the top surface of the central block 110B, wherein the first and second branched passages 111A and 111B form respective openings at the bottom surface of the central block 110B.

Further, the lower block 110C is formed with first and second gas passages 111C and 112C such that the first gas passages 111C are in communication with the first passages 111B and the second gas passages 112C are in communication with the second passages 112B at the top surface of the block 110C. Thereby, the first and second gas passages 111C and 112C form gas outlet openings uniformly distributed at the bottom surface of the lower block 110C.

Thus, the $TiCl_4$ gas from the gas source 150 is injected into the showerhead 110 at the first inlet port 111 and is then introduced into the reactor vessel 120 from the showerhead 110, and the $NH_3$ gas from the gas source 160 is injected into the showerhead 110 at the first inlet port 112 and is introduced into the reactor vessel 120 from the showerhead 110, wherein the $TiCl_4$ gas and the $NH_3$ gas are mixed uniformly in the reactor vessel 120.

In the deposition apparatus of FIG. 11, there is further formed a third gas inlet port 113 in the showerhead 110, wherein a $Si_2H_6$ gas from a gas source 170 is supplied to the gas inlet port 113 via a line 171. The $Si_2H_6$ gas thus injected into the showerhead 110 is guided through a gas passage 112A and is introduced into the reactor vessel 120 from a lower gas passage 112C.

While not illustrated, the showerhead 110 includes a further gas inlet port for introducing an inert gas such as an Ar gas or $N_2$ gas into the reactor vessel 120 as a dilution gas.

On the top side of the showerhead 110, there is provided a heater 114, and the temperature of the showerhead 110, and hence the temperature of the gases introduced into the reactor vessel 120 from the showerhead 110, is controlled to a predetermined temperature. By activating the heater 114, it is also possible to prevent deposition of reaction byproduct on the surface of the showerhead 110.

It should be noted that the reactor vessel 120 is also provided with a heater 121 on the circumferential wall as well as on the top and bottom walls, and the deposition of reaction byproduct on the inner surface of the reactor vessel 120 is eliminated by driving the heater 121.

In the construction of FIG. 11, there is further provided a guide ring 132 on the circumferential wall of the stage 130 for guiding the wafer W transported by a wafer transport mechanism not illustrated to the central part of the stage 130. Further, the stage 130 includes a heater 180 for controlling the temperature of the wafer W, wherein the heater 180 is driven by a power supply 181 via a controller 182.

Further, the evacuation tube 140 is connected to a vacuum pump 190 via a conductance valve 191, and the pressure inside the reactor 120 is controlled as desired by controlling the conductance of the valve 191. The evacuation system of the CVD apparatus of FIG. 11 may also include a trap unit at one of the inlet side and the outlet side of the pump 190. The trap may include a cooling mechanism for improving the trap efficiency.

In the deposition apparatus of FIG. 11, it should be noted that there is further provided a switching valve 150A between the $TiCl_4$ source 150 and the gas line 151, wherein the switching valve 151 is controlled by a process controller 100 and switches the flow of the $TiCl_4$ gas of the gas source 150 between the line 151 leading to the showerhead 110 and a pre-flow line 150B provided between the switching valve 150A and the vacuum pump 190.

Thus, the switching valve 150A supplies the $TiCl_4$ gas of the source 150 to the reactor 120 in a first state thereof while the TiCl4 gas is bypassed to the vacuum pump 190 via the pre-flow line 150B in the second state of the valve 150A.

Figure 12:
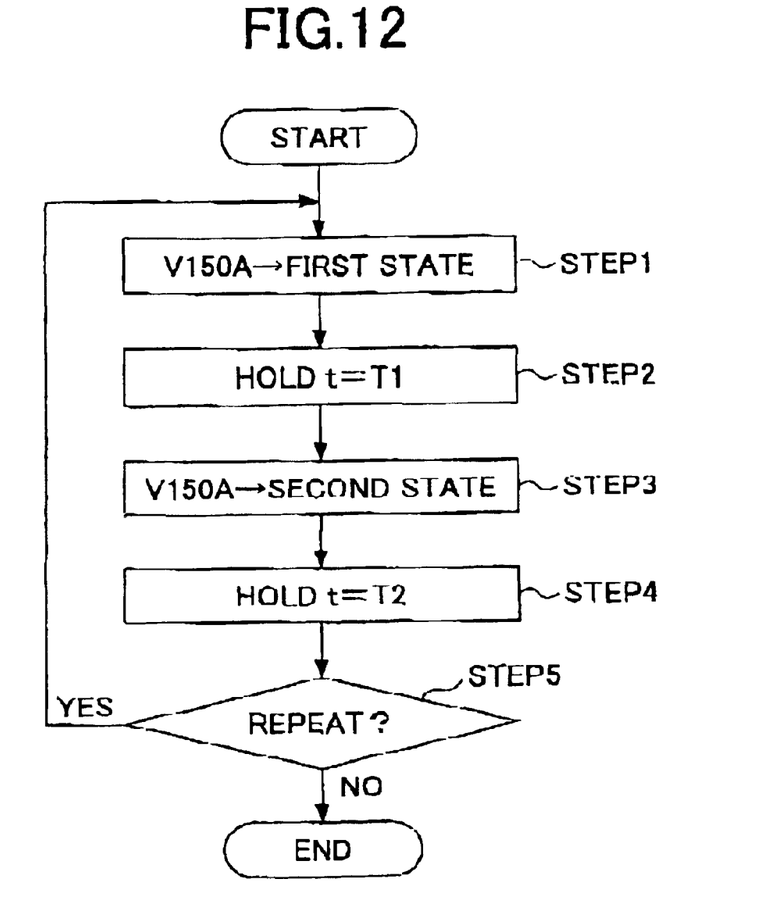
FIG. 12 is a flowchart showing the process control used in the second embodiment.

FIG. 12 is a flowchart showing the process of forming a TiSiN film according to the second embodiment by using the deposition apparatus of FIG. 9 under the control of the process controller 100.

Referring to FIG. 12, the valve 150A is switched to a first state in a step 1 and the $TiCl_4$ gas from the gas source 150 is supplied to the reactor 120.

Next, in the step 2, the first state of the valve 150A is continued for a predetermined interval T1, and the valve 150A is switched to a second state in a step 3 wherein the $TiCl_4$ gas is bypassed to the pre-flow line 150B.

Next, in the step 4, the second state of the valve 150A is continued for a predetermined interval T2, and the process returns to the foregoing step 1 after a discrimination step in the step 5. Thereby, the switching valve 150A resumes the first state.

When it is judged in the step 5 that the foregoing steps 1–4 are repeated for a predetermined times, the deposition process of the TiSiN film is terminated.

In the steps 2 and 4, it should be noted that the durations T1 and T2 may be changed with the growth of the TiSiN film. For example, the duration T2 of the step 3 may be increased when forming the surface part of the TiSiN film, which is subjected to particularly sever oxidation process, so as to increase the thickness of the layer enriched with Si and hence the effect of oxygen blocking, while the duration T2 may be decreased in the case of forming the bottom part of the TiSiN film and increase the duration T1 for minimizing the specific resistance.

Third Embodiment

Figure 13A:
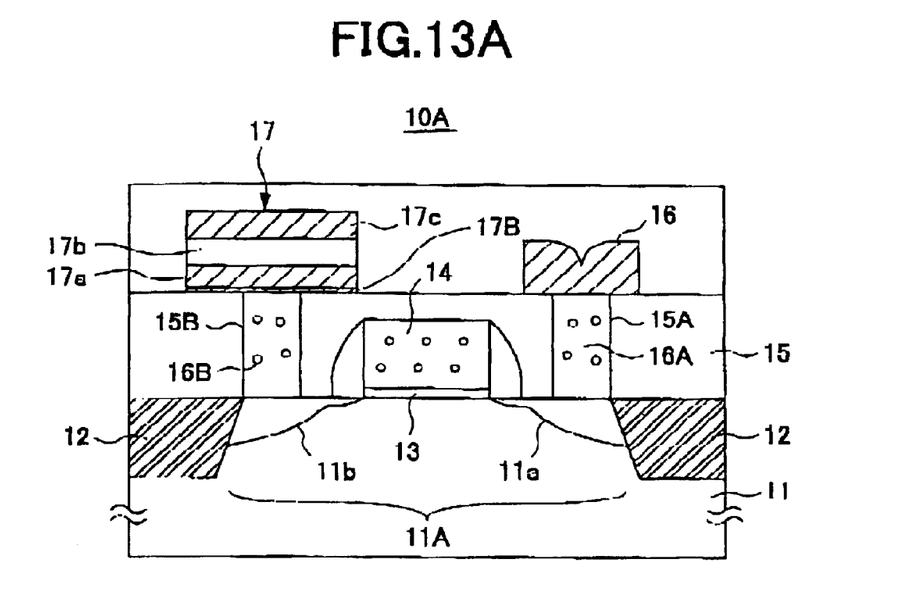
FIGS. 13A and 13B are diagrams showing the construction of a DRAM according to a third embodiment of the present invention.
Figure 13B:
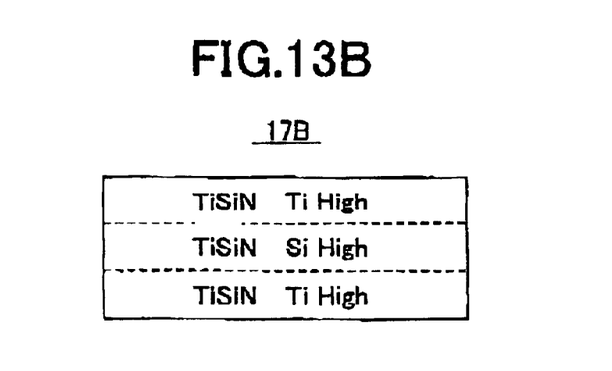

FIGS. 13A and 13B show the construction of a DRAM having the MIM capacitor 17 according to a third embodiment of the present invention, wherein those parts explained previously are designated by the same reference numerals and the description thereof will be omitted.

Referring to FIG. 13A, the DRAM of the present embodiment includes an oxidation-resistant barrier layer 17B having a structure shown in FIG. 13B, between the MIM capacitor 17 and the contact plug 16B.

Referring to FIG. 13B, the barrier layer 17B is formed of a TiSiN film and has a structure similar to the one shown in FIG. 6 in which a layer enriched with Ti and a layer enriched with Si are stacked alternately and repeatedly.

In the illustrated example, a TiSiN layer enriched with Si is sandwiched by a pair of TiSiN layers enriched with Ti, wherein the TiSiN layer enriched with Si functions as an oxygen barrier by capturing oxygen penetrated into the TiSiN film 17B.

It should be noted that the oxidation-resistance barrier film 17B of FIG. 13B can be formed by using the deposition apparatus of FIG. 11 acceding to the flowchart of FIG. 12.

Of course, it is possible to form the TiSiN film such that a TiSiN layer enriched with Ti is sandwiched by a pair of TiSiN layers enriched with Si.

Further, it should be noted that the TiSiN film having the structure of FIG. 6 is effective not only for the oxygen barrier film of an MIM capacitor but is also effective for a Cu diffusion barrier film in a multilayer interconnection structure that uses Cu as a conductive body and formed by a dual damascene process.

Further, the gaseous source of Ti is not limited to TiCl4 but materials such as TDEAT (tetrakisdiethylaminotitanium) or TDMAT (tetrakisdimethylaminotitanium) may be used. Further, the gaseous source of Si is not limited to $Si_2H_6$ but $SiH_4$ or $SiH_2Cl_2$ may also be used. Further, the gaseous source of N is not limited to NH3 but it is also possible to use nitrogen radical activated by plasma. Further, the lower electrode 17a is not limited to Ru but an oxidation-resistant metal such as Ir or Pt may also be used.

Further, the present invention is not limited to the embodiments described heretofore, but various variations and modifications may be made without departing from the scope of the invention.

The present invention is based on the Japanese priority application 2002-030059 filed on Feb. 6, 2002, the entire contents thereof being incorporated herein as reference.

What is claimed is:

1. A method of forming a conductive film containing Ti, Si and N on a substrate by supplying a gaseous source of Ti, a gaseous source of Si and a gaseous source of N, comprising:

a first supplying of said gaseous source of Ti, said gaseous source of Si and said gaseous source of N to a surface of said substrate simultaneously to grow said conductive film; and a second supplying of said gaseous source of Si and said gaseous source of N to said surface of said substrate while supplying said gaseous source of Ti is interrupted to grow said conductive film further, wherein said first supplying and said second supplying are conducted alternately and repeatedly.

2. A method as claimed in claim 1, wherein a flow rate of said gaseous source of Si and a flow rate of said gaseous source of N are held constant in said first supplying and said second supplying.

3. A method as claimed in claim 1, wherein said gaseous source of Ti is $TiCl_4$.

4. A method as claimed in claim 1, wherein said gaseous source of Si is selected from the group consisting of $SiH_4$, $Si_2H_6$, $SiH_2Cl_2$ and combinations thereof.

5. A method of forming a conductive film containing Ti, Si and N on a substrate by supplying a gaseous source of Ti, a gaseous source of Si and a gaseous source of N, comprising:

supplying said gaseous source of Ti, said gaseous source of Si and said gaseous source of N to a surface of said substrate simultaneously; and interrupting supplying of said gaseous source of Ti intermittently, and increasing and decreasing repeatedly and alternately a partial pressure of said Ti gaseous source.

6. A method as claimed in claim 5, wherein a partial pressure of said gaseous source of Si and a partial pressure of said gaseous source of N are held constant.

7. A method of forming a TiSiN film on a substrate by supplying a gaseous source of Ti, a gaseous source of Si and a gaseous source of N, comprising:

growing a first TiSiN film by supplying said gaseous source of Ti and said gaseous source of Si and said gaseous source of N simultaneously to a surface of said substrate; and growing a second TiSiN film from said gaseous source of Ti and said gaseous source of Si and said gaseous source of N on said first TiSiN film while interrupting supplying of said gaseous source of Ti intermittently.

8. The method as claimed in claim 7, wherein said growing said second TiSiN film is conducted with a duration shorter than a duration of said growing said first TiSiN film.

9. The method as claimed in claim 7, wherein said growing said second TiSiN film includes using a residual gaseous source of Ti remaining after said growing said first TiSiN film.

10. The method as claimed in claim 7, wherein a concentration level of Ti in said second TiSiN film is lower than a concentration level of Ti in said first TiSiN film.

11. The method as claimed in claim 7, wherein a concentration level of Si in said second TiSiN film is higher than a concentration level of Si in said first TiSiN film.

12. The method as claimed in claim 7, wherein a partial pressure of said gaseous source of Ti in said growing said second TiSiN film is lower than a partial pressure of said gaseous source of Ti in said growing said first TiSiN film.

13. The method as claimed in claim 7, wherein a partial pressure of said gaseous source of Si and a partial pressure of said gaseous source of N are maintained constant in said growing said first TiSiN film and said growing said second TiSiN film.

* * * * *